(12) United States Patent
Kasai

(10) Patent No.: US 6,255,218 B1
(45) Date of Patent: Jul. 3, 2001

(54) SEMICONDUCTOR DEVICE AND FABRICATION METHOD THEREOF

(75) Inventor: Naoki Kasai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/387,518

(22) Filed: Sep. 1, 1999

Related U.S. Application Data

(62) Division of application No. 08/617,730, filed on Apr. 1, 1996, now abandoned.

(30) Foreign Application Priority Data

Mar. 30, 1995 (JP) ..................................... 7-72923

(51) Int. Cl.⁷ .................................. H01L 21/311
(52) U.S. Cl. ............................. 438/700; 438/703
(58) Field of Search ................ 438/444, 425, 438/424, 426, 427, 451, 450, 692, 781, 790, 700, 702, 703; 257/395, 396, 397, 510, 511, 512, 513

(56) References Cited

U.S. PATENT DOCUMENTS

| | | | |
|---|---|---|---|
| 4,666,556 | * 5/1987 | Fulton et al. | 438/431 |
| 4,714,520 | * 12/1987 | Gwozdz | 438/699 |
| 4,810,668 | 3/1989 | Ito . | |
| 4,825,277 | * 4/1989 | Mattox et al. | 257/639 |
| 4,968,636 | * 11/1990 | Sugawara | 438/766 |
| 5,001,533 | 3/1991 | Yamaguchi . | |
| 5,733,383 | * 3/1998 | Fazan et al. | 438/424 |

FOREIGN PATENT DOCUMENTS

| | | |
|---|---|---|
| 59-204236 | 11/1984 | (JP) . |
| 62-130523 | 6/1987 | (JP) . |
| 5-198526 | 8/1993 | (JP) . |

OTHER PUBLICATIONS

P. Fazan et al., "A Highly Manufacturable Trench Isolation Process for Deep Submicron DRAMs," 1993 IEEE, pp. 3.6.1–3.6.4.

B. Davari et al, A New Planarization Technique, Using a Combination of Rie and Chemical Mechanical Polish (CMP) 1989 IEEE, PP. 3.4.1–3.4.4.

* cited by examiner

Primary Examiner—Benjamin L. Utech
Assistant Examiner—Duy-Vu Deo
(74) Attorney, Agent, or Firm—Sughrue, Mion, Zinn, Macpeak & Seas, PLLC

(57) ABSTRACT

A semiconductor device that enables to avoid short-circuit between an interconnection film and an underlying conductive region even when a contact hole is partially overlapped with an isolation insulator. A conductive region is selectively formed in an active region to be contacted therewith. An interlayer insulating film having a contact hole is formed to cover the active region and the isolation insulator. An interconnection film is formed on the interlayer insulator film to be contacted with the conductive region through the contact hole. The isolation region contains a first insulating subregion and a second insulating subregion formed on the first insulating subregion. The first insulating subregion is positioned at a deeper level than that of the second insulating subregion. The second insulating subregion may be formed in self-alignment to the first insulating subregion and may have a substantially flat surface. A part of the second insulating subregion is exposed in the contact hole so that the contact area of the interconnection film with the conductive region is partially defined by the isolation region.

6 Claims, 15 Drawing Sheets

SEMICONDUCTOR DEVICE AND FABRICATION METHOD THEREOF

This is a divisional of application No. 08/617,730 filed Apr. 1, 1996 now abandoned, the disclosure of which is incorporated herein by reference.

BACKGROUND OF THE INVENTION

1. Field of the Invention

The present invention relates to a semiconductor device and more particularly, to a semiconductor device having a conductive region formed to be in contact with an isolation insulator and an interconnection film contacted with the conductive region through an interlayer insulating film.

2. Description of the Prior Art

Typically, a semiconductor device has a diffusion region formed in an active region of a semiconductor substrate. The diffusion region is opposite in conductivity type to the substrate. The active region is defined by an isolation insulator formed selectively in the surface area of the substrate. An interlayer insulating film is formed to cover the diffusion region. An interconnection or wiring film having a contact hole is formed in the interlayer insulating film. The interconnection film is contacted with the underlying diffusion region through the contact hole to thereby realize electrical interconnection between the interconnection film and the diffusion region.

Conventionally, in the design process of the semiconductor device, the mask alignment for the above contact structure has been so determined that the contact hole is surely located on the diffusion region by giving sufficient values to the alignment margins.

Recently, with the decreasing dimension caused by progress in microfabrication technology, the integration level of the semiconductor devices on the substrate has been becoming higher and higher. To cope with this tendency, it has become indispensable for the mask alignment margins to decrease to a level as small as possible.

However, the decrease of the mask alignment margins causes various problems and as a result, it is essential to improve the contact structure and to develop fabrication processes realizing the improved structure.

Although a large number of semiconductor devices are produced and integrated on the semiconductor substrate, only one of the devices is explained in this specification for the sake of simplification of description.

FIGS. 1A to 1D show a first example of the conventional fabrication methods of a semiconductor device, respectively.

First, a pad oxide ($SiO_2$) film 102 is formed on a surface of a p-silicon substrate 101. A silicon nitride ($Si_3N_4$) film 103 is formed on the film 102, and is patterned to have a specified plan shape. Using this patterned film 103 as a mask, an p-type dopant is selectively ion-implanted into the substrate 101 to form a channel stop region 104.

Then, using this patterned silicon nitride film 103 as a mask, the surface of the substrate 101 is selectively oxidized by a thermal oxidation process, thereby producing a field oxide film 105 serving as an isolation insulator for defining active regions. The field oxide film 105 constitutes an isolation region. The state at this stage is shown in FIG. 1A.

Subsequently, the silicon nitride film 103 and the pad oxide film 102 are removed and then as shown in FIG. 1B, a gate oxide film 106 for a metal-oxide-semiconductor field-effect transistor (MOSFET) is selectively formed on the surface of the active region. A gate electrode 107a for the MOSFET is selectively formed on the gate oxide film 106.

Using the field oxide film 105 and the gate electrode 107a as a mask, an n-type dopant is ion-implanted into the substrate 101 and is followed by an annealing process, thereby producing an n-diffusion region 108 in the active region, as shown in FIG. 1B. This region 108 serves as a source/drain region of the MOSFET.

Further, an interlayer insulating film 109 is deposited to cover the active region and the field oxide film 105 over the entire substrate 101. A patterned resist film 110 with a penetrating window 111 is formed on the interlayer insulating film 109, as shown in FIG. 1C.

Using the patterned resist film 110 as a mask, the underlying interlayer insulating film 109 is selectively etched. Thus, a contact hole 112 exposing the surface of the substrate 101 is produced in the film 109, as shown in FIG. 1D. The resist film 110 is then removed.

Finally, as shown in FIGS. 2 and 3, an aluminum (Al) alloy film 113 is formed on the interlayer insulator film 109. The film 113 is then patterned to thereby produce an interconnection or wiring film. The interconnection film 113 is contacted with the underlying n-type diffusion region 108 through the contact hole 112.

If the mask alignment error exceeds the specified alignment margin during the process of forming the contact hole 112, the opposing edge of the field oxide film 105 to the diffusion region (source/drain region) 108 is also etched, as shown in FIG. 1D. As a result, the interconnection film 113 is contacted with the substrate 101 itself at a position 129 outside the diffusion region 108. This means that the interconnection film 113 and the substrate 101 are in short-circuit.

A similar problem to the above occurs in a semiconductor device with the trench isolation structure. Although various types of the trench isolation structures have been developed, only one of them is shown here.

FIGS. 4A to 4I show a second example of the conventional fabrication methods of a semiconductor device, respectively, which was disclosed in IEDM Technical Digest, pp57–60, 1993.

First, a pad oxide film 202 is formed on a surface of a p-silicon substrate 201. A silicon nitride film 203 is then formed on the film 202. Using a masking film (not shown), the surface area of the substrate 201 is selectively etched together with the films 202 and 203, thereby producing a trench 214 having a specified plan shape and a specified depth in the substrate 201.

Next, as shown in FIG. 4B, a silicon oxide film 215 is formed on the inner surface of the trench 214 by a thermal oxidation process. Boron is selectively ion-implanted into the substrate 201 through the film 215, thereby forming a p-type ion-implantation region 216.

A silicon dioxide film 217 is deposited on the silicon nitride film 203 and in the trench 217. The film 217 is then removed except for the inside of the trench 214 by a planarization process such as a chemical mechanical polishing (CMP) process. Thus, the trench 214 is filled with the remaining dioxide film 217. At the same time, the surfaces of the films 203 and 217 are planarized, as shown in FIG. 4C.

Thereafter, the silicon nitride film 203 is removed. At this stage, the top of the silicon dioxide film 217 becomes higher than the pad oxide film 202. A pair of sidewall spacers 228 made of silicon dioxide are formed on the film 202 at each side of the film 217, as shown in FIG. 4D.

The remaining pad oxide film 202 and the pair of sidewall spacers 228 are selectively removed by a wet etching process, thereby producing an isolation insulator made of the buried silicon dioxide film 217 in the trench 214, as shown in FIG. 4E. The isolation insulator defines an active region.

Subsequently, as shown in FIG. 4F, the implanted boron ions are annealed to thereby form a channel stop region 204 below the trench 214. The region 204 surrounds the bottom and side faces of the trench 214. Then, a gate oxide film 206 for a MOSFET is selectively formed on the surface of the active region. A gate electrode 207a for the MOSFET is selectively formed on the gate oxide film 206.

Using the isolation oxide film 217 and the gate electrode 207a as a mask, an n-type dopant is ion-implanted into the substrate 201, thereby producing an n-diffusion region 208 in the active region, as shown in FIG. 4F. This region 208 serves as a source/drain region of the MOSFET.

Further, an interlayer insulating film 209 is deposited to cover the active region and the isolation oxide film 217 over the entire substrate 201. A patterned resist film 210 with a penetrating window 211 is formed on the interlayer insulating film 209, as shown in FIG. 4G.

Using the patterned resist film 210 as a mask, the underlying interlayer insulating film 209 is selectively etched. Thus, a contact hole 212 exposing the surface of the substrate 201 is produced in the film 209, as shown in FIG. 4H. The resist film 210 is then removed.

Finally, as shown in FIG. 4I, an aluminum-alloy film 213 is formed on the interlayer insulator film 209 and in the contact hole 212. The film 213 is then patterned to thereby produce an interconnection or wiring conductor film. The interconnection film 213 is contacted with the underlying n-type diffusion region 208 through the contact hole 212.

If the mask alignment error exceeds the specified alignment margin during the process of forming the contact hole 212, the opposing edge of the insulating film 217 to the diffusion region (source/drain region) 208 and the corresponding part of the silicon dioxide film 215 are also etched, as shown in FIG. 4H. As a result, the interconnection film 213 is contacted with the exposed substrate 201 itself at a position 229 outside the diffusion region 208. This means that the interconnection film 213 and the substrate 201 are in short-circuit.

To solve the above problem, an improved fabrication method was developed as shown in FIGS. 5A to 5G, which was disclosed in the Japanese Non-Examined Patent Publication No. 62-130523 published in 1987.

First, a pad oxide film 302 with a thickness of 20 nm is formed on a surface of a p-silicon substrate 301. A silicon nitride film (as an oxidation-resistant film) 303 with a thickness of 100 nm is formed on the film 302. The film 303 is then patterned to have a specified plan shape. Using this patterned film 303 as a mask, the surface of the substrate 301 is selectively oxidized by a thermal oxidation process, thereby producing a field oxide film 305 defining an active region. The field oxide film 305 constitutes an isolation insulator. The state at this stage is shown in FIG. 5A.

Subsequently, without removing the silicon nitride film 303 and the pad oxide film 302, a silicon dioxide film 318 with a thickness of 100 nm to 200 nm is formed over the entire substrate 301 by a chemical vapor deposition (CVD) process, as shown in FIG. 5B.

Then, the film 318 is removed over the entire substrate 301 by a reactive ion etching (RIE) process. Thus, the film 318 is selectively left at the end 303a of the film 303 over the field oxide film 305, as shown in FIG. 5C.

The silicon nitride film 303 and the pad oxide film 302 are selectively removed by a RIE process, thereby exposing the surface of the active region of the substrate 301, as shown in FIG. 5D.

Thereafter, a gate oxide film 306 for a MOSFET is selectively formed on the exposed surface of the active region by a thermal oxidation process. The film 306 has a thickness of 20 nm.

A polysilicon film with a thickness of 300 nm is formed on the entire substrate 301. Phosphorus (P) is doped into the polysilicon film by a thermal diffusion process. The phosphorus-doped polysilicon film is patterned by a RIE process, resulting in an n-type polysilicon gate electrode 307a for the MOSFET on the gate oxide film 306.

Using the gate electrode 307a and the field oxide film 305 as a mask, an n-type dopant such as arsenic (As) is selectively ion-implanted into the substrate 301 at a dose of $5 \times 10^{15}$ atoms/cm$^2$ with an acceleration energy of 70 keV. Following this, the substrate 301 is annealed at a temperature of 940° C. for 20 minutes. Thus, an n-diffusion region 308 serving as a source/drain region of the MOSFET in the active region, as shown in FIG. 5E.

Further, a silicon nitride film 319 with a thickness of 50 nm and an AsSG film 309 with a thickness of 500 nm are successively formed to cover the active and isolation regions over the entire substrate 301. Then, a patterned resist film 320 with a penetrating window 311 is formed on the AsSG film 309, as shown in FIG. 5F.

Using the patterned resist film 320 as a mask, the underlying films 309 and 319 are selectively etched by a RIE process until the diffusion region 308 is exposed. Thus, a contact hole 312 exposing the surface of the substrate 301 is produced in the films 309 and 319, as shown in FIG. 5G. During this RIE process, the remaining silicon nitride film 303 on the field oxide film 305 serves as an etching stop, and as a result, the end of the film 305 is ensured to be protected by the film 303 from the etching action. The resist film 320 is then removed. The state at this stage is shown in FIG. 5G.

Finally, an interconnection film (not shown) is formed on the AsSG film 309 to be contacted with the diffusion region 308 in the subsequent processes. These process are performed by the same manner as above.

With the conventional method disclosed in the Japanese Non-Examined Patent Publication No. 62-130523, because of the etching stop action of the remaining silicon nitride film 303 on the field oxide film 305, the film 305 can be effectively prevented from being etched. Thus, the exposure of the substrate 301 can be avoided at a position below the end of the film 305. This means that no short-circuit between the interconnection film and the substrate 301 itself takes place outside the diffusion region 308.

However, with the conventional method of the Japanese Non-Examined Patent Publication No. 62-130523, the following problems occur.

First, it is difficult to control the lateral width of the remaining silicon nitride film 303 on the field oxide film 305 because this film 303 is obtained during the selective etching process as shown in FIG. 5C.

In consideration with further miniaturization of the semiconductor devices on the substrate 301, it is preferred that the width of the silicon nitride film 303 is as narrow as possible. On the other hand, the film 303 must cover or overlap the periphery of the active region. Accordingly, the mask alignment margin for the process of patterning the film 303 needs to be sufficiently large. In other words, the contact area between the diffusion region 308 and the interconnection film varies or fluctuates within a wide range dependent upon the alignment errors which have been generated during the patterning process of the film 303 and the formation process of the contact hole 312. This leads to obstruction or barrier for further miniaturization and integration of the semiconductor devices.

Second, when the width of the remaining silicon nitride film 303 is made narrow, (i.e., the bird's beak of the field oxide film 305 is made small), there arises a possibility of contact between the interconnection film and the substrate 301. The reason is that the etching stop function cannot be obtained sufficiently if the position of the contact hole 312 is shifted so that the contact hole 312 contains the film 303 therein.

Third, since the remaining film 303 increases the offset or step on the surface of the substrate 301, it is not suitable for the multilevel interconnection structure. Especially during the RIE process for forming the gate electrode 307a, the polysilicon film for the gate electrode 307a tends to be left in the vicinity of the film 303, which increases the danger of short-circuit between the adjoining MOSFETs.

SUMMARY OF THE INVENTION

Accordingly, an object of the present invention is to provide a semiconductor device and a fabrication method thereof that enables to realize an improved contact structure between a conductive region formed in contact with an isolation insulator and an overlying interconnection film while decreasing the danger of short-circuit therebetween.

Another object of the present invention is to provide a semiconductor device and a fabrication method thereof in which the short-circuit between the conductor and the interconnection film can be avoided even if a contact hole is partially overlapped with the isolation insulator.

Still another object of the present invention is to provide a semiconductor device and a fabrication method thereof that enables to realize a well-planarized surface of an interconnection film.

The above objects together with others not specifically mentioned will become clear to those skilled in the art from the following description.

A semiconductor device according to a first aspect of the present invention includes a conductive region selectively formed in an active region to be contacted with an isolation insulator. An interlayer insulating film having a contact hole is formed to cover the active region and the isolation insulator. An interconnection conducting film is formed on the interlayer insulator film to be contacted with the conductive region through the contact hole.

The isolation insulator contains a first insulating subregion located at a relatively lower level and a second insulating subregion located at a relatively higher level with respect to the substrate.

The second insulating subregion is different in material from the interlayer insulating film.

With the semiconductor device according to the first aspect of the invention, the isolation region contains the first insulating subregion located at a relatively lower level and the second insulating subregion located at a relatively higher level with respect to the substrate. Also, the material of the second insulating subregion is different from that of the interlayer insulating film.

Accordingly, the material of the second insulating subregion can be so selected that the second insulating subregion is more difficult to be patterned than the interlayer insulating film during the patterning process of the interlayer insulating film. As a result, even if the contact hole is formed to be partially overlapped with the isolation insulator, no short-circuit takes place between the substrate and the interconnection film. In other words, an improved contact structure between the conductive region and the interconnection film can be realized.

Also, since no film such as the silicon nitride film 303 shown in FIG. 5D exists on the isolation insulator, a well-planarized surface of the interconnection film can be realized.

Additionally, since the second insulating subregion is located at a higher level than that of the first insulating subregion, the second insulating subregion can be produced by using a mask used for forming the first insulating subregion. This means that the second insulating subregion can be produced in self-alignment to the first insulating subregion. Consequently, the formation of the first and second insulating subregions as the isolation insulator give no effect to degradation in dimension accuracy for the isolation insulator. In other words, the formation of the first and second insulating subregions do not become a barrier for further miniaturization and integration of semiconductor devices.

In a preferred embodiment of the first aspect, the second insulating subregion is partially overlapped with the contact hole of the interlayer insulating film. In this case, an additional advantage that the contact area of the interconnection film with the conductive region can be adjusted by controlling the overlapping area.

In another preferred embodiment of the first aspect, the first insulating subregion is made of silicon oxide and the second insulating subregion is made of silicon nitride or silicon oxinitride.

A fabrication method of a semiconductor device according to a second aspect of the present invention includes the following steps:

(a) An oxidation-resistant film is selectively formed on a surface of a semiconductor substrate of a first conductivity type.

(b) The substrate is selectively oxidized using the oxidation-resistant film as a mask, thereby forming selectively a field insulator film in a surface area of the substrate.

(c) The field insulator film is selectively removed using the oxidation-resistant film as a mask until the top of the remaining field insulator film is lower than the surface of the substrate, thereby forming a first insulating subregion.

(d) A second insulating film is formed to cover the first insulating subregion.

(e) The second insulating film is selectively removed to thereby form a second insulating subregion on the first insulating subregion. The first insulating subregion and the second insulating subregion constitute an isolation insulator defining an active region in the surface area of the substrate.

(f) A conductive region of a second conductivity type is selectively formed in the active region to be contacted with the isolation insulator.

(g) An interlayer insulating film is formed to cover the active region and the isolation insulator. The interlayer insulator film is different in material from the first insulating subregion.

(h) A contact hole is formed by a selective etching process in the interlayer insulating film to expose the conductive region. The process has an etch rate for the interlayer insulating film greater than that for the second insulating subregion.

(i) A patterned interconnection film is formed on the interlayer insulating film to be contacted with the conductive region through the contact hole.

With the fabrication method according to the second aspect of the invention, the field insulator film is selectively removed until the top of the remaining field insulator film is lower than the surface of the substrate, thereby forming a first insulating subregion serving as a part of the isolation insulator. The second insulating film is selectively removed to thereby form a second insulating subregion on the first insulating subregion serving as another part of the isolation insulator.

Further, the interlayer insulating film is different in material from the second insulating subregion, and the contact hole is formed by a selective etching process in which the etch rate for the interlayer insulating film is greater than that for the second insulating subregion.

Accordingly, even if the contact hole is formed to be partially overlapped with the isolation insulator, no short-circuit takes place between the substrate and the interconnection film. In other words, an improved contact structure therebetween can be realized.

Also, since no film such as the silicon nitride film 303 shown in FIG. 5D is formed on the isolation insulator, a well-planarized surface of the interconnection film can be realized.

In addition, since the second insulating subregion is be produced by using the same mask for the first insulating subregion. This means that the second insulating subregion can be produced in self-alignment to the first insulating subregion. This means that the formation of the first and second insulating subregions do not become a barrier for further miniaturization and integration of semiconductor devices.

In a preferred embodiment of the second aspect, the oxidation-resistant film is made of silicon nitride, and the first insulating film is made of silicon oxide and the second insulating film is made of silicon nitride or silicon oxinitride.

In another preferred embodiment of the second aspect, the step (e) of selectively removing the second insulating film is performed by a chemical mechanical polishing process.

A fabrication method of a semiconductor device according to a third aspect of the present invention includes the following steps:

(a) A trench is selectively formed in a surface area of a semiconductor substrate of a first conductivity type.
(b) A first insulating film is formed on the surface area to bury the trench.
(c) The first insulating film is selectively removed until the top of the remaining first insulating film is lower than a surface of the substrate, thereby forming a first insulating subregion.
(d) A second insulating film is formed to cover the first insulating subregion.
(e) The second insulating film is selectively removed to thereby form a second insulating subregion on the first insulating subregion. The first insulating subregion and the second insulating subregion constitute an isolation insulator defining an active region in the surface area of the substrate.
(f) A conductive region of a second conductivity type is selectively formed in the active region to be contacted with the isolation region.
(g) An interlayer insulating film is formed to cover the active region and the isolation insulator. The interlayer insulator film is different in material from the second insulating subregion.
(h) A contact hole is formed by a selective etching process in the interlayer insulating film to expose the conductive region. The process has an etch rate for the interlayer insulator film greater than that for the second insulating subregion.
(i) A patterned interconnection film is formed on the interlayer insulating film to be contacted with the conductive region through the contact hole.

With the fabrication method according to the third aspect of the invention, the same advantages as those of the method according to the second aspect can be obtained, because this method uses the trench isolation structure instead of the selective oxidation process in the method of the first aspect.

In a preferred embodiment of the third aspect, the first insulating film is made of silicon oxide and the second insulating film is made of silicon nitride or silicon oxinitride.

In another preferred embodiment of the third aspect, the step (e) of selectively removing the second insulating film is performed by a chemical mechanical polishing process.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1A:
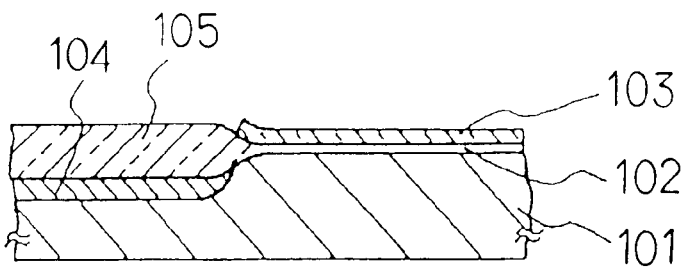
FIGS. 1A to 1D are partial cross-sectional views of a semiconductor device, which show a first example of the conventional fabrication methods, respectively.
Figure 1B:
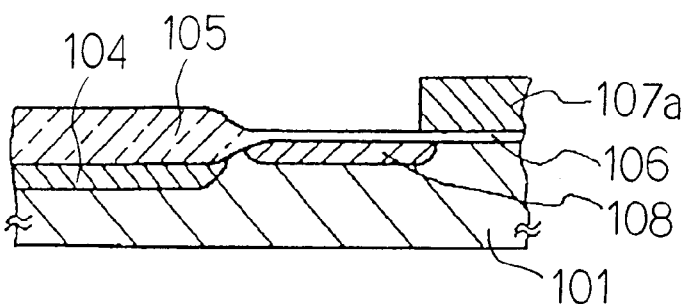
Figure 1C:
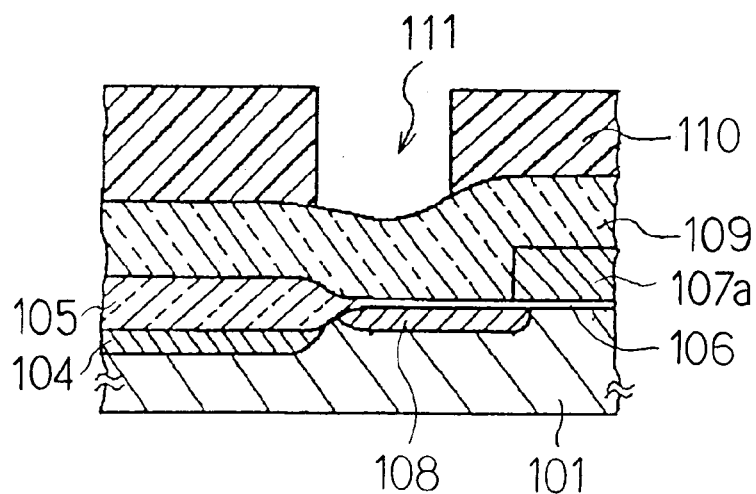
Figure 1D:
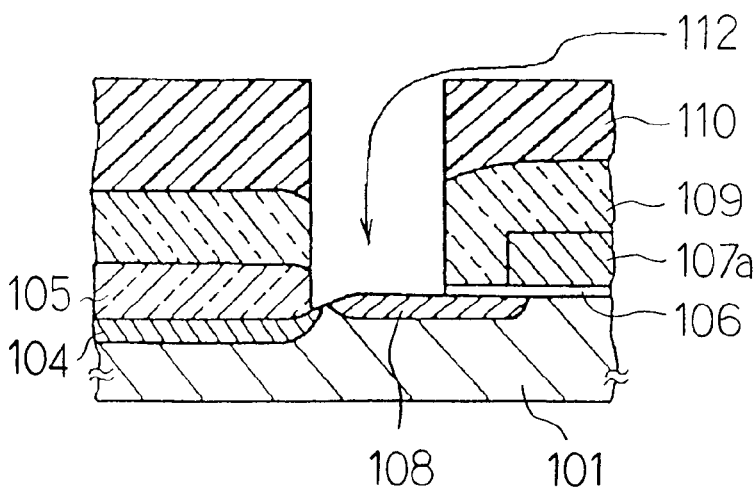

Preferred embodiments of the present invention will be described in detail below while referring to the drawings attached.

First Embodiment

Figure 6:
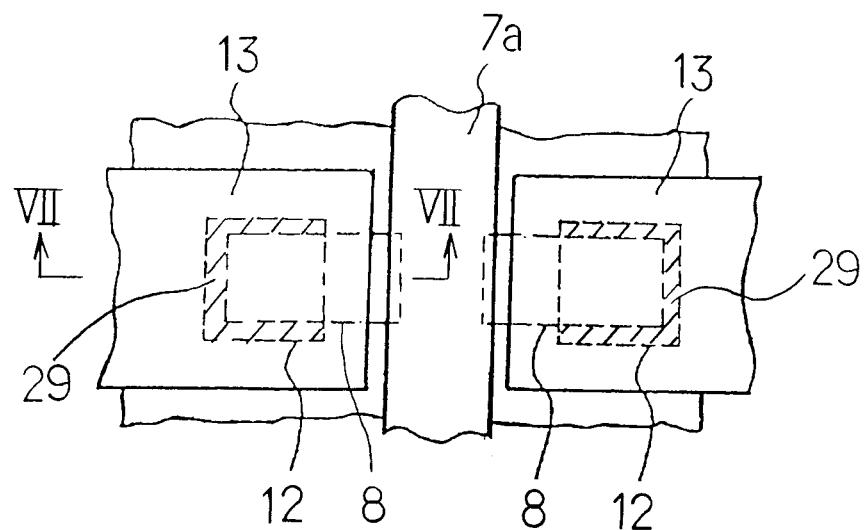
FIGS. 6 is a partial plan view of a semiconductor device, which shows a fabrication method according to a first embodiment of the invention.
Figure 7:
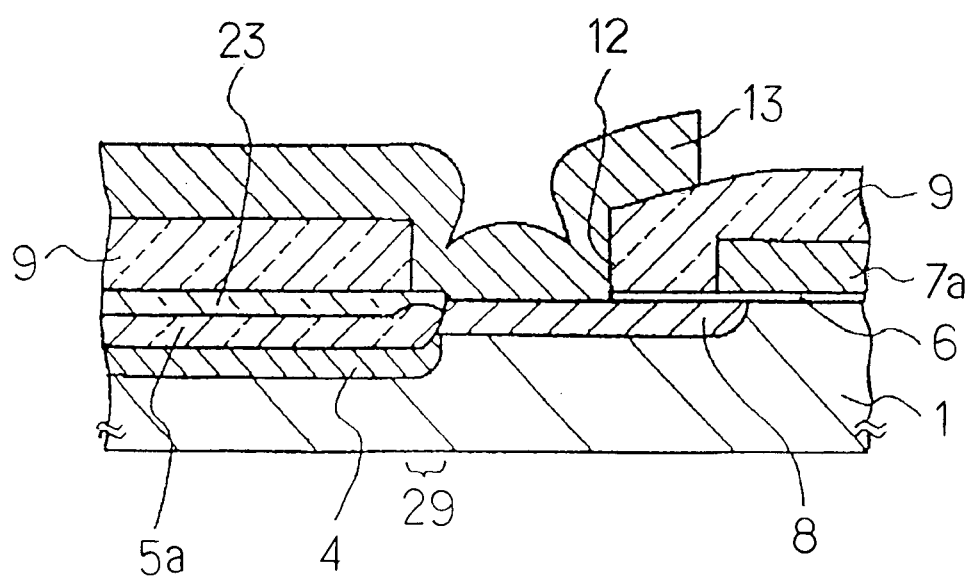
FIGS. 7 is a partial cross-sectional view of the semiconductor device along the line VII—VII in FIG. 6, which shows the fabrication method according to the first embodiment.

As shown in FIGS. 6 and 7, a semiconductor device according to a first embodiment of the invention contains a p-type semiconductor substrate 1 with an isolation insulator thereon. The isolation insulator is selectively formed on the surface area of the substrate 1. Although the isolation insulator defines a plurality of active regions, the following explanations will be provided only for one of the active regions for the sake of simplicity.

An n-type diffusion region 8 as a conductive region is selectively formed in the active region. The region 8 is contacted with the isolation insulator made of a first insulating subregion 5a located at a relatively lower level and a second insulating subregion 23 located at a relatively higher level with respect to the substrate 1.

The first insulating subregion 5a is made of silicon dioxide. The second insulating subregion 23 is made of silicon nitride. Therefore, the first and second insulating subregions 5a and 23 are different in material from each other.

A p-type channel stop region 4 is formed in the substrate 1 below the first insulating subregion 5a.

A gate oxide film 6 for a MOSFET is selectively formed on the active region. A gate electrode 7a for the MOSFET is formed on the gate oxide film 6. The n-type diffusion region 8 serves as a source/drain region of the MOSFET.

A patterned interlayer insulating film 9 having a contact hole 12 is formed to cover the active region and the isolation insulator. The contact hole 12 penetrates the gate oxide film 6. The film 9 is made of boro-phosphosilicate glass (BPSG). Therefore, the first and second insulating subregions 5a and 23 are different in material from the interlayer insulating film 9.

A patterned interconnection conducting film 13 is formed on the interlayer insulator film 9 to be contacted with the diffusion region 8 through the contact hole 12.

The contact hole 12 is partially overlapped with the isolation insulator made of the insulating films 5a and 23. Therefore, the interconnection film 13 is partially contacted with the second insulating subregion 23 made of silicon nitride at a relatively higher level.

The active region has a rectangular plan shape and the contact hole 12 has a square plan shape.

The effective area of the contact hole 12 (i.e., the contact area of the interconnection film 13 and the diffusion region 8) is determined by the overlap area of the hole 12 with the silicon nitride film 23. Accordingly, it is sufficient for this device to chiefly consider the mask alignment margin for the contact hole 12 and the gate electrode 7a. The mask alignment margin for the contact hole 12 and the diffusion region 8 scarcely needs to be considered.

The semiconductor device as shown in FIGS. 6 and 7 is fabricated by the following process sequence.

Figure 8A:
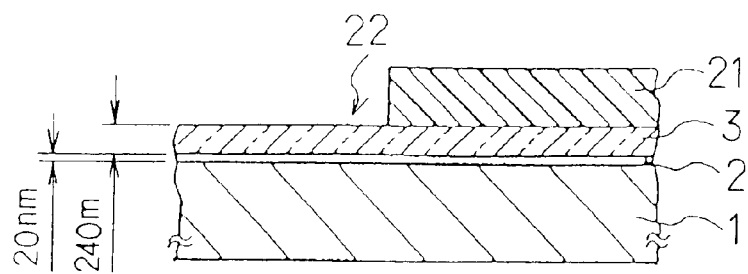
FIGS. 8A to 8L are partial cross-sectional views of a semiconductor device along the line VII—VII in FIG. 6, which show the fabrication method according to the first embodiment, respectively.

First, as shown in FIG. 8A, a pad oxide ($SiO_2$) film 2 with a thickness of 20 nm is formed on a surface of a p-silicon substrate 1. A silicon nitride ($Si_3N_4$) film 3 with a thickness of 240 nm is formed on the film 2. A patterned resist film 21 is formed on the film 3. The resist film 21 has a window at a position corresponding to the device region. The state at this stage is shown in FIG. 8A.

Figure 8B:
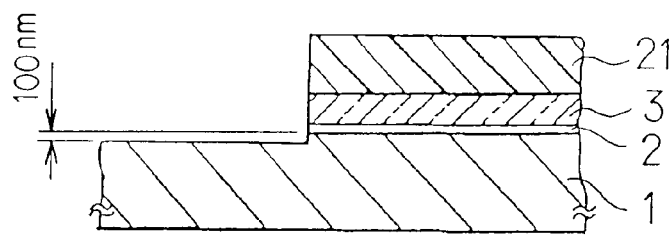
Figure 8C:
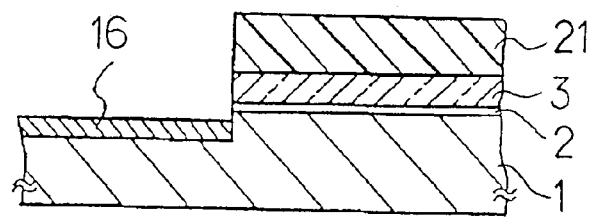

Next, the underlying silicon nitride film 4 and pad oxide film 2 and the surface area of the substrate 1 are etched by a RIE etching process. The etch depth of the substrate 1 is, for example, 100 nm, as shown in FIG. 8B. Boron is selectively ion-implanted into the substrate 1 to form an ion-implantation region 16, as shown in FIG. 8C.

Figure 8D:
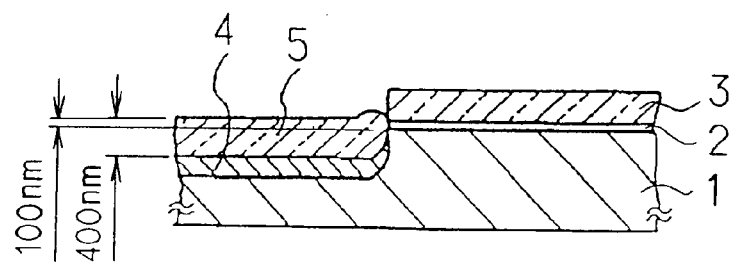

After removing the resist film 21, using the silicon nitride film 3 as a mask, the surface area of the substrate 1 is selectively oxidized by a popular local oxidation of silicon (LOCOS) process. Thus, a field oxide film 5 with a thickness of 400 nm is produced on the region 16, as shown in FIG. 8D. At this time, the ion-implantation region 16 becomes a channel stop region 4.

Figure 8E:
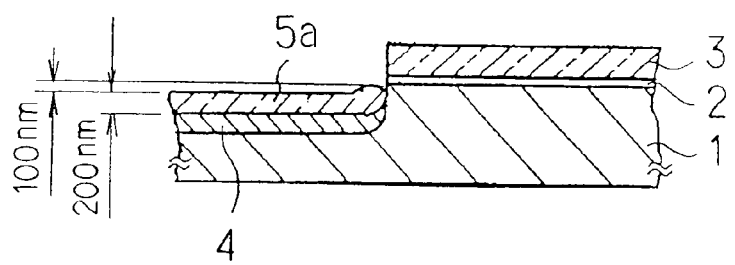

Using the silicon nitride film 3 as a mask, the field oxide film 5 is selectively etched by a RIE etching process, the etched depth of which is 200 nm. When a gaseous mixture of $CF_4$ and $CH_2F_2$ is used as an etching gas, the etching selectivity of 30 or more can be realized. As a result, the etching depth of the silicon nitride film 3 is limited to 10 nm or less. Also, since the field oxide film 5 is etched by 200 nm in depth, the remaining film 5 has a thickness of 200 nm. This means that the surface of the film 5 is lower than the surface of the substrate 1 by approximately 100 nm. The state at this stage is shown in FIG. 8E.

Figure 8F:
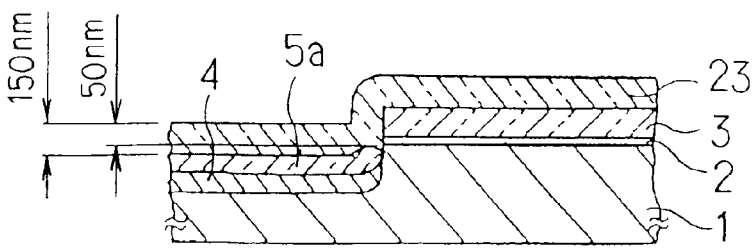

Subsequently, a silicon nitride film 23 with a thickness of 150 nm is deposited over the entire substrate 1 by a chemical vapor deposition (CVD) process. At this stage, the height of the film 23 is higher than the surface of the substrate 1 by approximately 50 nm, as shown in FIG. 8F.

Figure 8G:
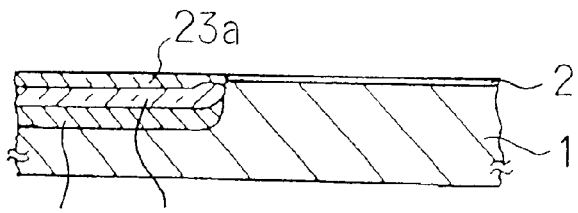

The silicon nitride films 23 and 3 are subjected to a chemical mechanical polishing (CMP) process until the entire film 3 is removed and the pad oxide film 2 is exposed therefrom. Thus, the exposed surface of the pad oxide film 2 is in the same height as that of the film 23, and the surface of this structure becomes flat, as shown in FIG. 8G. At this stage, the remaining silicon nitride film 23a on the field oxide film 5a has a thickness of approximately 100 nm.

Thus, the isolation insulator made of the field oxide film 5a and the silicon nitride film 23a is obtained.

The silicon nitride film 23a (i.e., the second insulating subregion) can be produced in self-alignment to the underlying field oxide film 5a (i.e., the first insulating subregion) by using the same mask (i.e., the silicon nitride film 3) for the field oxide film 5.

Figure 8H:
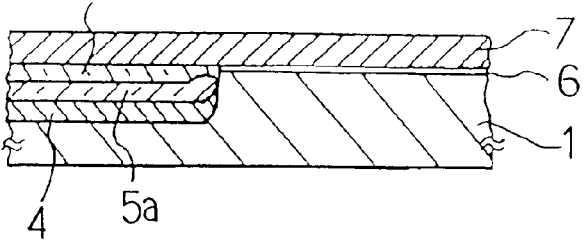

Following this, the pad oxide film 2 is removed by a wet etching process using a hydrogen fluoride (HF) solution, thereby exposing the surface of the substrate 1. Then, a gate oxide film 6 with a thickness of 10 nm is selectively formed on the exposed surface of the substrate 1 by a thermal oxidation process. An n-type polysilicon film 7 with a thickness of 200 nm is then deposited by a CVD process over the entire substrate 1. The state at this stage is shown in FIG. 8H.

Figure 8I:
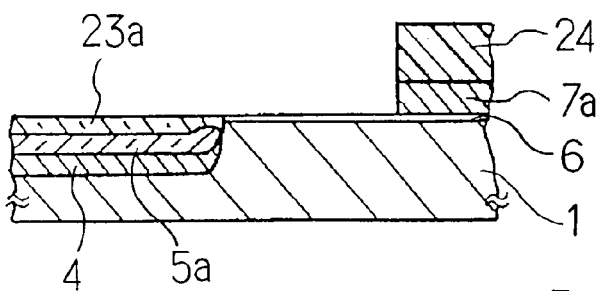

A patterned resist film 24 is formed on the polysilicon film 7. Using this film 24 as a mask, the polysilicon film 7 is selectively etched to thereby form the gate electrode 7a, as shown in FIG. 8I. The film 24 is then removed.

Figure 8J:
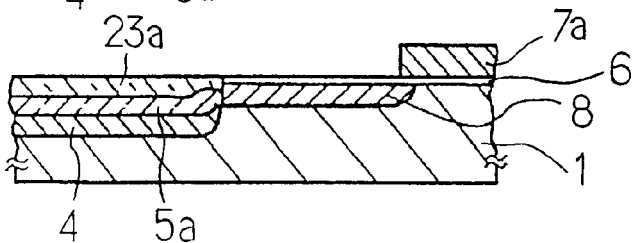

Further, using the isolation insulator made of the films 23a and 5a and the gate electrode 7a as a mask, an n-type dopant such as arsenic (As) is selectively ion-implanted into the substrate 1 with a dose of $4 \times 10^{15}$ atoms/$cm^2$ at an acceleration energy of 50 keV. The substrate 1 is then annealed at a temperature of 850° C. for 30 minutes. Thus, the n-type diffusion region 8 (which serves as a source/drain region) is produced in the substrate 1, as shown in FIG. 8J.

A silicon dioxide film with a thickness of 100 nm and a BPSG film with a thickness of 400 nm are successively deposited over the entire substrate 1, and then, they are annealed at a temperature of 850° C. for 30 minutes. Thus, an interlayer insulator film 9 made of the BPSG and silicon dioxide films is obtained.

Figure 8K:
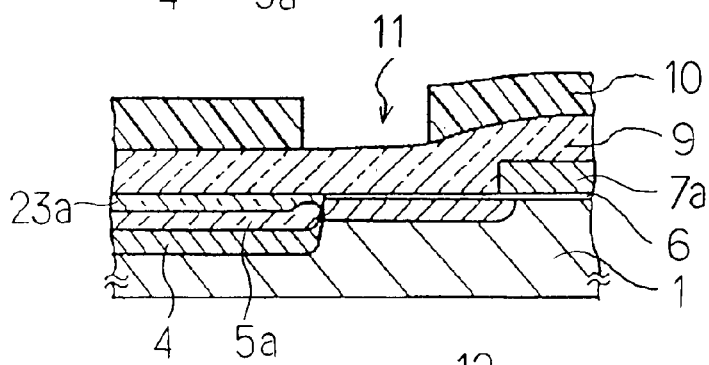
Figure 8L:
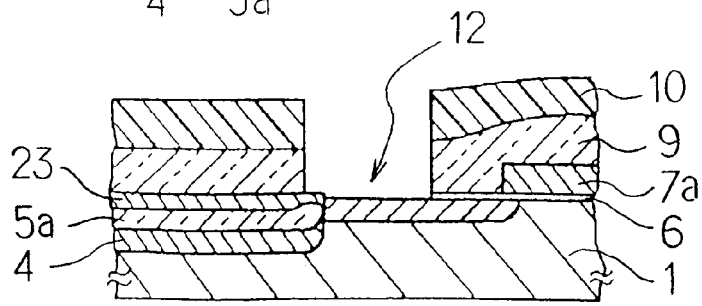

A patterned resist film 10 with a window 11 is formed on the interlayer insulator film 9, as shown in FIG. 8K. The window 11 is used for the formation of the contact hole 12. Using this resist film 10 as a mask, the interlayer insulator film 9 is etched to form the contact hole 12 in the film 9, as shown in FIG. 8L.

In this process of forming the contact hole 12, by using a gaseous mixture of $CF_4$ and $CH_2F_2$ as an etching gas, a sufficiently high etching selectivity can be realized. This is similar to the above etching process for the field oxide film 5. Therefore, the silicon nitride film 23a serves as an etching stop in the window 11, and as a result, there is not possibility that the contact hole 12 reaches the substrate 1 within the isolation region.

Finally, as shown in FIGS. 6 and 7, a patterned interconnection film 13 made of an aluminum alloy film is formed to be contacted with the diffusion region 8. Thus, the semiconductor device containing an n-channel MOSFET is obtained.

As described above, with the semiconductor device according to the first embodiment, the isolation insulator has only slight offsets on its top face and as a result, it can be said that the top surface has a good flatness. This means that this embodiment is suitable for multilevel wiring structure.

Also, the polysilicon film as a material for the gate electrode 7a does not remain and consequently, there is no possibility that the gate electrodes of the adjoining MOSFETs are in short-circuit.

Figure 2:
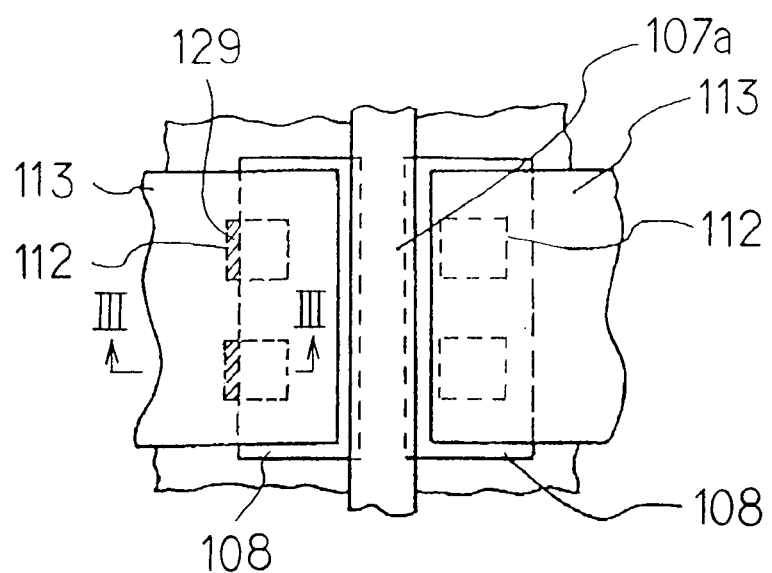
FIG. 2 is a partial plan view of the semiconductor device, which shows the first example of the conventional fabrication methods.
Figure 3:
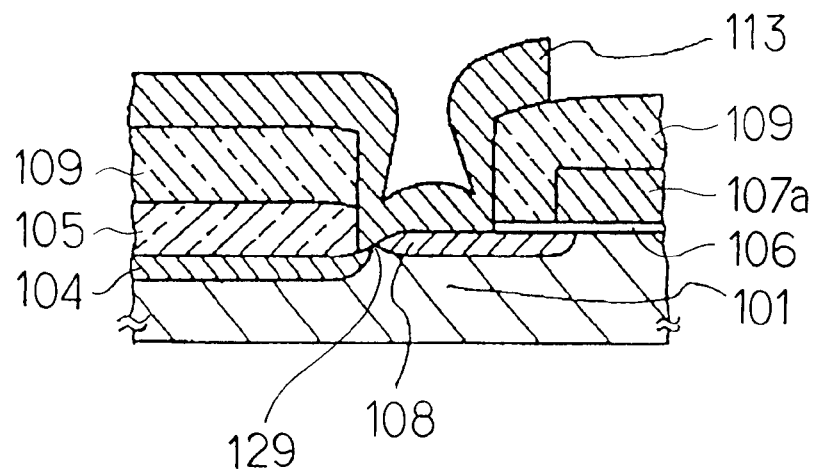
FIG. 3 is a partial cross-sectional view of the semiconductor device along the line III—III in FIG. 2, which shows the first example of the conventional fabrication methods.
Figure 4A:
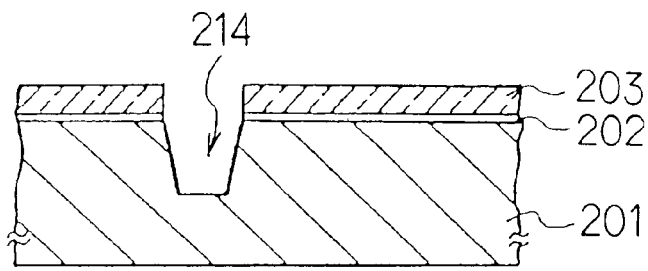
FIGS. 4A to 4I are partial cross-sectional views of a semiconductor device along the line III—III in FIG. 2, which show a second example of the conventional fabrication methods, respectively.
Figure 4B:
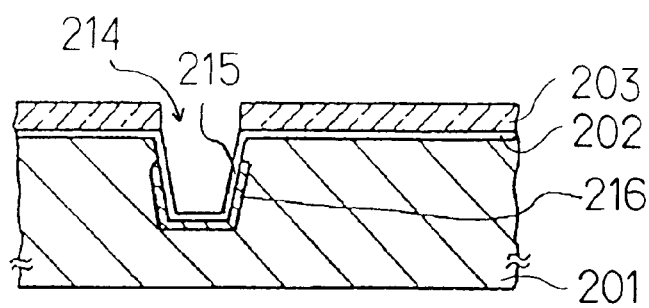
Figure 4C:
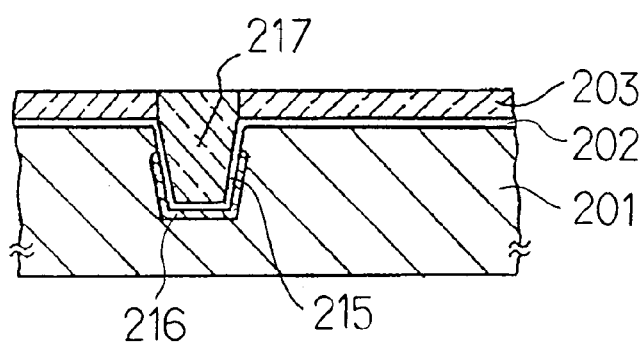
Figure 4D:
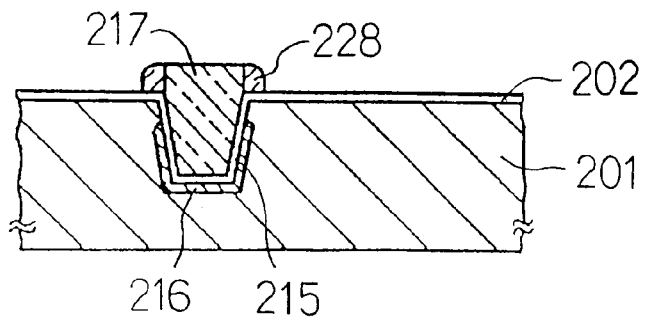
Figure 4E:
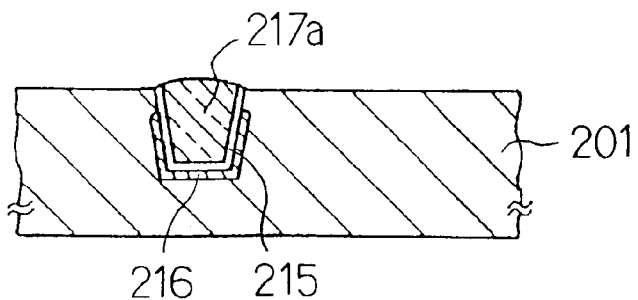
Figure 4F:
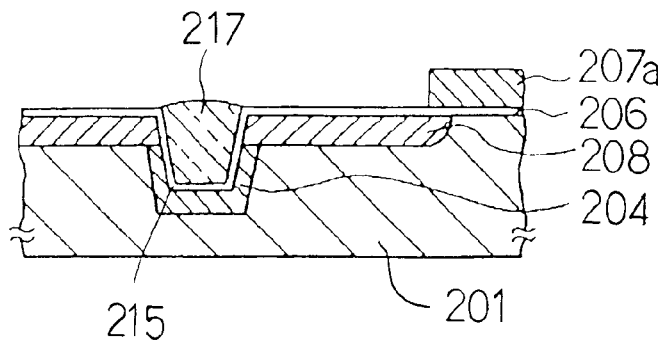
Figure 4G:
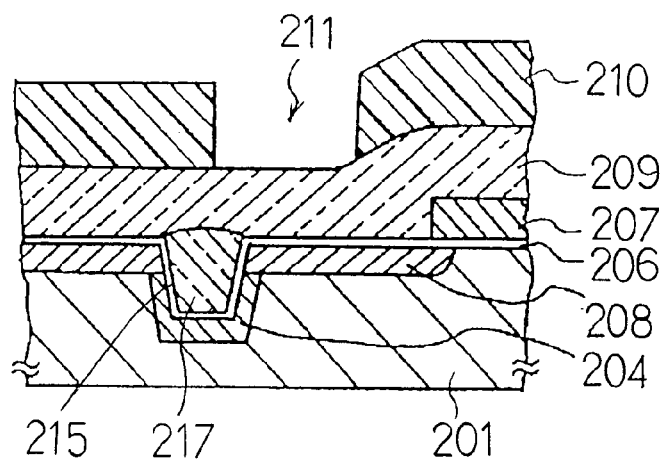
Figure 4H:
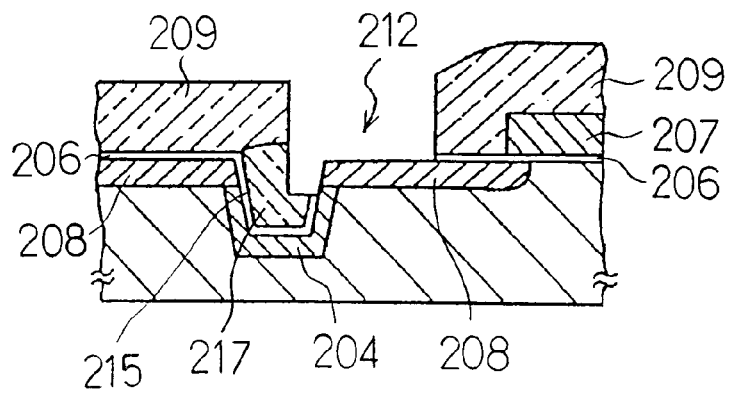
Figure 4I:
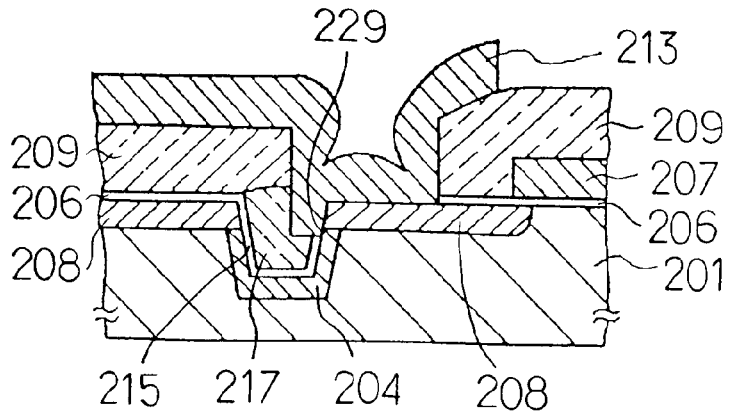
Figure 5A:
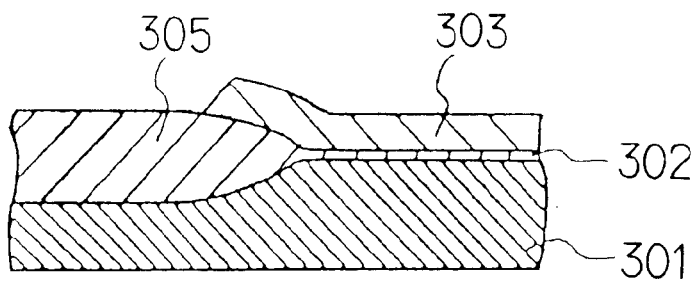
FIGS. 5A to 5G are partial cross-sectional views of a semiconductor device, which show a third example of the conventional fabrication methods, respectively.
Figure 5B:
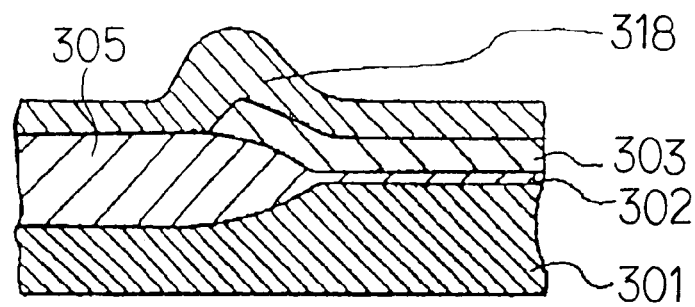
Figure 5C:
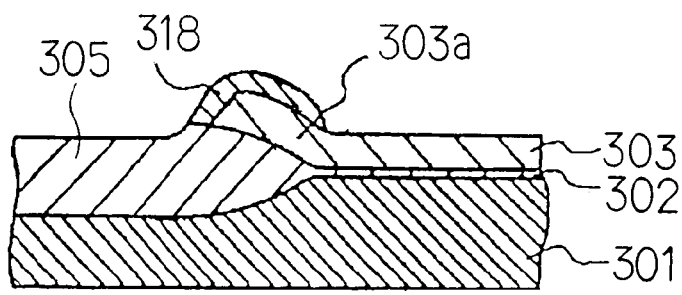
Figure 5D:
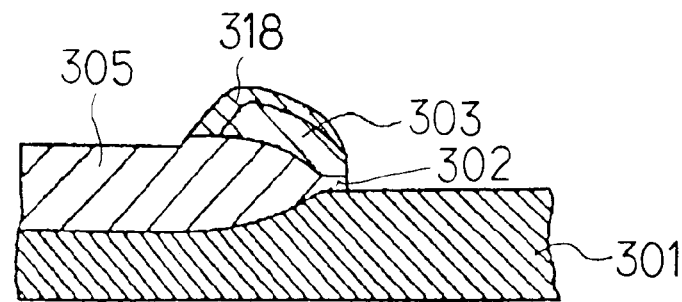
Figure 5E:
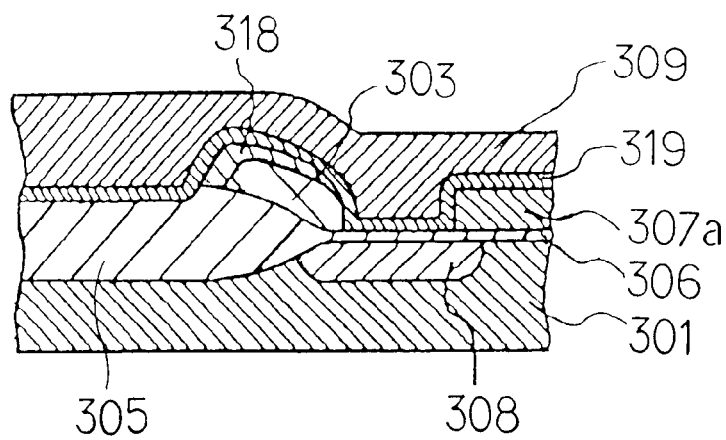
Figure 5F:
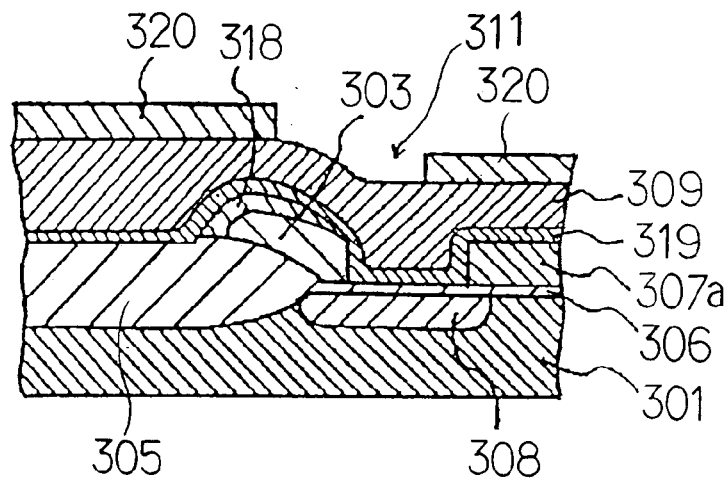
Figure 5G:
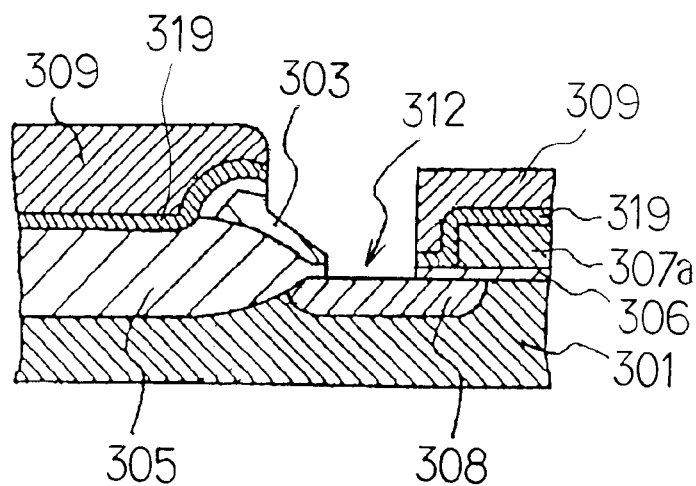

Although the contact hole 12 is designed to be greater in width than the diffusion region 8 in this embodiment (see FIG. 6), a plurality of smaller contact holes may be provided in the same manner as that of conventional one of FIGS. 2 and 3.

Second Embodiment

Figure 9:
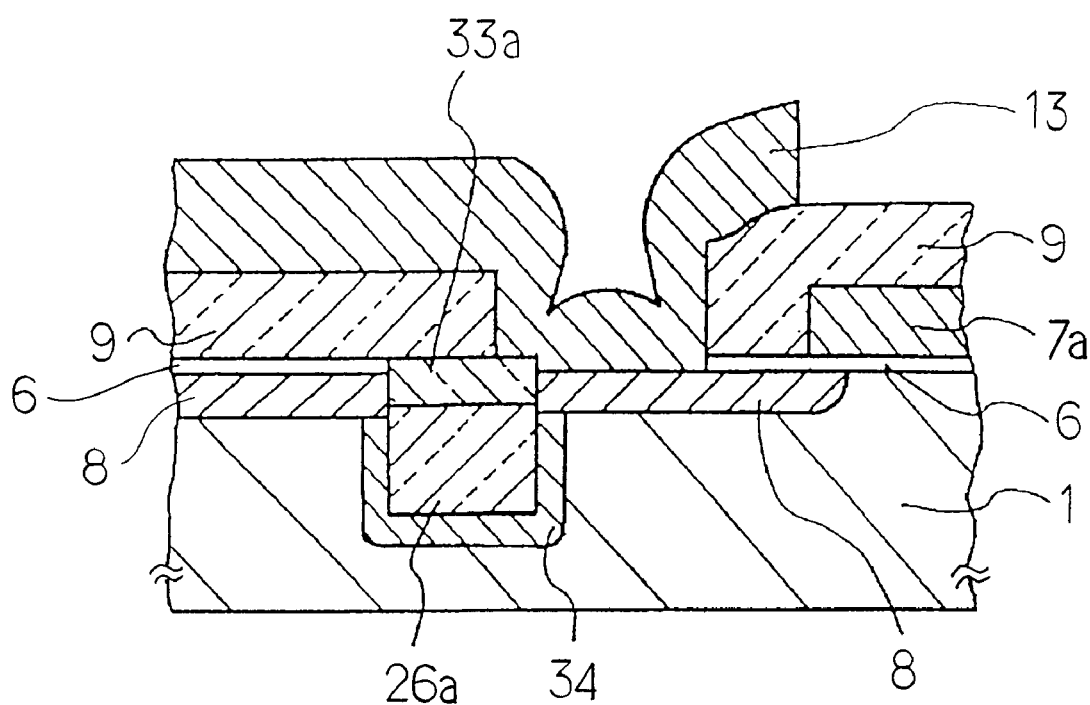
FIGS. 9 is a partial cross-sectional view of a semiconductor device, which shows a fabrication method according to a second embodiment of the invention.

FIG. 9 shows a semiconductor device according to a second embodiment of the invention, which is the same in structure as the first embodiment except for a trench isolation structure.

The device according to the second embodiment has an additional advantage of a reduced occupation area of the isolation insulator.

Figure 10A:
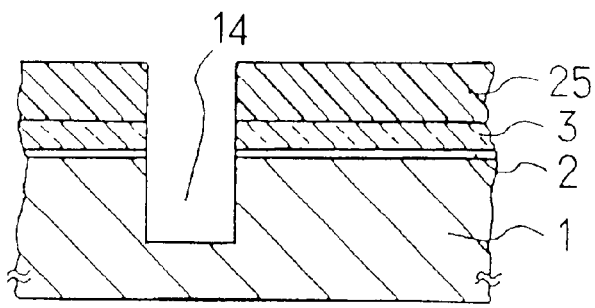
FIGS. 10A to 10K are partial cross-sectional views of a semiconductor device, which show the fabrication method according to the second embodiment, respectively.

The device according to the second embodiment is fabricated by the following process steps:

First, a pad oxide film 2 is formed on a surface of a p-type silicon substrate 1 in the same manner as that of the first embodiment. A silicon nitride film 3 is then formed on the film 2. A patterned resist film 25 is formed on the film 3. Using the resist film 25 as a mask, the surface area of the substrate 1 is selectively etched together with the films 2 and 3, thereby producing a trench 14 having a specified plan shape and a depth of 500 nm in the substrate 1. The state at this stage is shown in FIG. 10A. The resist film 25 is then removed.

Figure 10B:
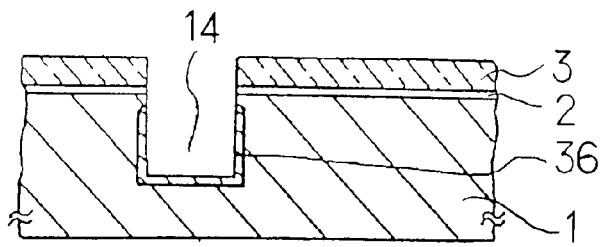

Next, Boron is selectively ion-implanted into the substrate 1 by an oblique implantation process, thereby forming a p-type ion-implantation region 36, as shown in FIG. 10B.

Figure 10C:
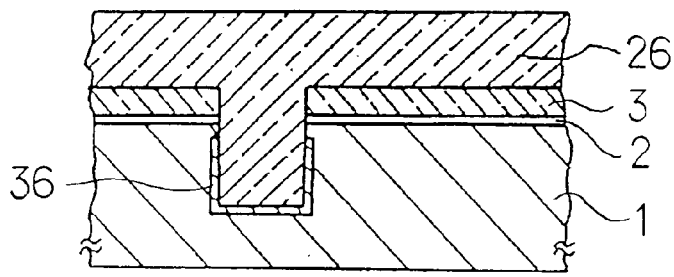

A silicon dioxide film 26 with a thickness of 500 nm is deposited on the silicon nitride film 3 over the entire substrate 1 to bury the trench 14, as shown in FIG. 10C.

Figure 10D:
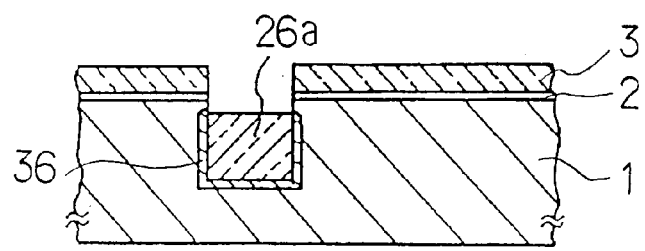

Next, using a gaseous mixture of $CF_4$ and $CH_2F_2$ as an etching gas, the silicon oxide film 26 is selectively etched by a RIE etching process. Thus, the etched depth of the film 26 is adjusted so that the top of the remaining film 26 in the trench 14 is located lower than the surface of the substrate 1 by approximately 100 nm, as shown in FIG. 10D.

Figure 10E:
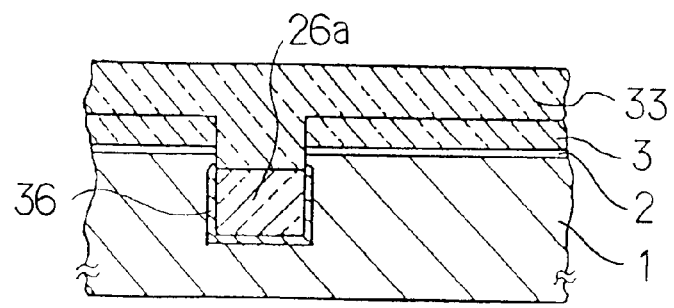

A silicon nitride film 33 with a thickness of 200 nm is deposited on the silicon nitride film 3 over the entire substrate 1, as shown in FIG. 10E.

Figure 10F:
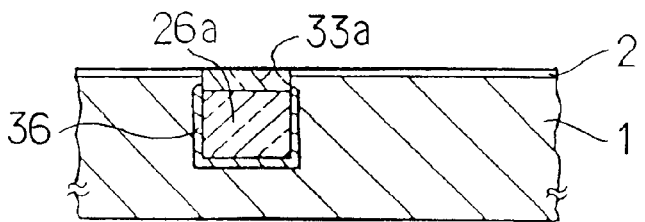

The silicon nitride films 33 and 3 are selectively removed by a CMP process until the surface of the pad oxide film 2 is exposed. As a result, the remaining silicon nitride film 33a is located on the silicon dioxide film 26a, as shown in FIG. 10F. In other words, the trench 14 is filled with the films 26a and 33a. The surface of this structure becomes substantially flat through this process. The remaining films 26a and 33a in the trench 14 constitute an isolation insulator.

The silicon nitride film 33a can be made in self-alignment to the trench 14 using the mask for forming the trench 14.

Figure 10G:
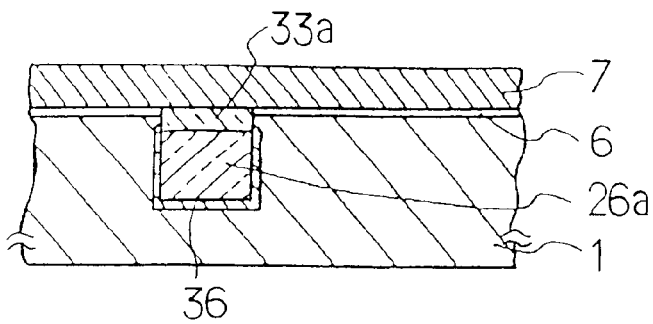

Subsequently, the remaining pad oxide film 2 is removed by a wet etching process. Then, a gate oxide film 6 for a MOSFET is selectively formed on the surface of the active region. An n-type polysilicon film 7 is deposited by a CVD process over the entire substrate 1. The state at this stage is shown in FIG. 10G.

Figure 10H:
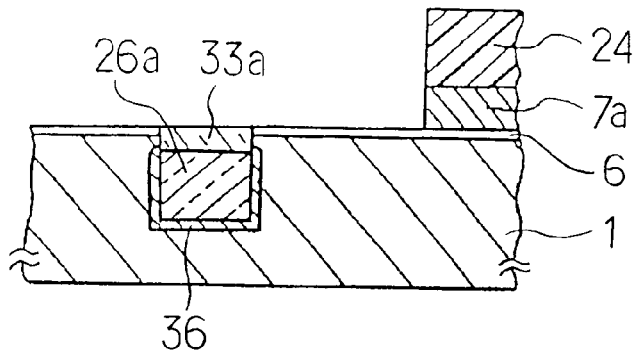

A patterned resist film 24 is formed on the polysilicon film 7. Using this film 24 as a mask, the polysilicon film 7 is selectively etched to thereby form the gate electrode 7a, as shown in FIG. 10H.

Figure 10I:
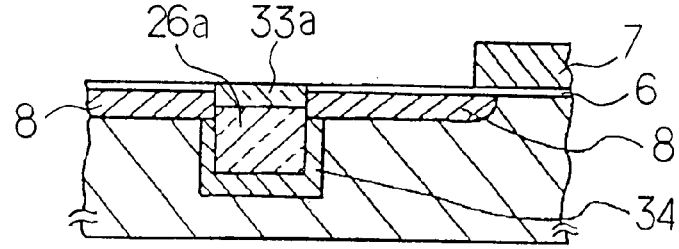

Using the isolation insulator and the gate electrode 7a as a mask, an n-type dopant is ion-implanted into the substrate 1 and annealed, thereby producing an n-diffusion region 8 in the active region, as shown in FIG. 10I. This region 8 serves as a source/drain region of the MOSFET. At this time, the implanted region 36 becomes a channel stop region 34.

Figure 10J:
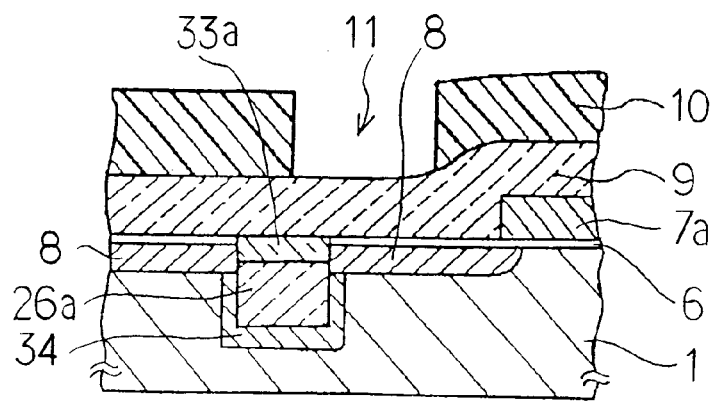

Further, an interlayer insulating film 9 is deposited to cover the active region and the isolation insulator over the entire substrate 1. A patterned resist film 10 with a penetrating window 11 is formed on the interlayer insulating film 9, as shown in FIG. 10J.

Figure 10K:
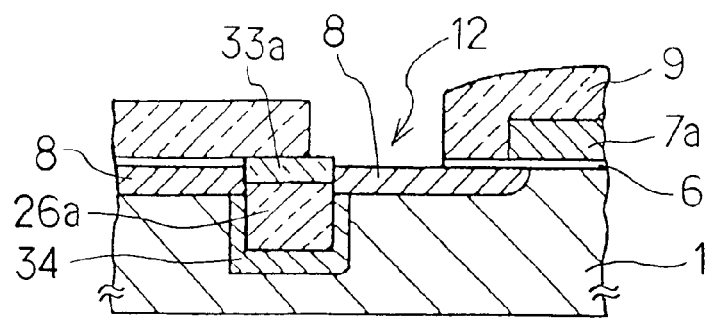

Using the patterned resist film 10 as a mask, the underlying interlayer insulating film 9 is selectively etched. Thus, a contact hole 12 exposing the surface of the substrate 1 is produced in the film 9, as shown in FIG. 10K. The resist film 10 is then removed.

Finally, as shown in FIG. 9, an aluminum-alloy film 13 is formed on the interlayer insulator film 9. The film 13 is then patterned to thereby produce an interconnection conductor film. The interconnection film 13 is contacted with the underlying n-type diffusion region 8 through the contact hole 12.

Through the process sequence as described above, the semiconductor device as shown in FIG. 9 is obtained.

As seen from the second embodiment, the present invention can be applied not only to the device fabricated by using the selective oxidation process but also to that having the trench isolation structure.

Third Embodiment

Figure 11:
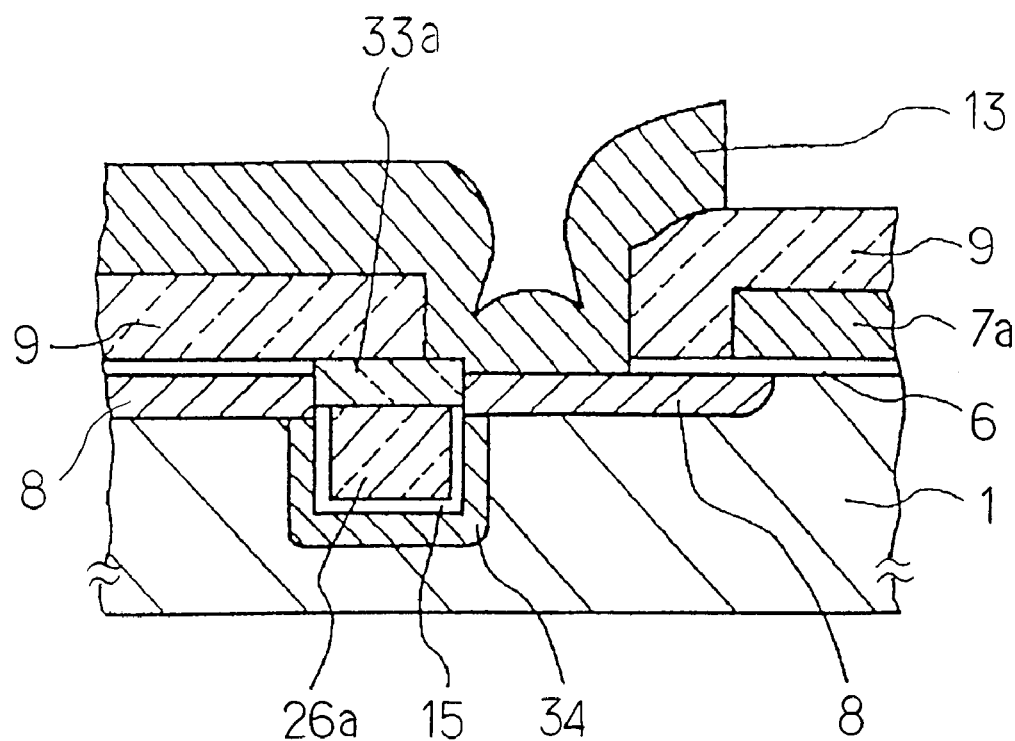
FIGS. 11 is a partial cross-sectional view of a semiconductor device, which shows a fabrication method according to a third embodiment of the invention.

FIG. 11 shows a semiconductor device according to a third embodiment of the invention, which is the same in structure as the second embodiment except that silicon dioxide film is formed to surround the bottom and side faces of a trench. Therefore, the device according to the third embodiment has an additional advantage of improved interfaces between the substrate 1 and the silicon dioxide film 26a buried in the trench 14.

The device according to the third embodiment is fabricated by the following process steps:

First, a pad oxide film 2 with a thickness of 20 nm and polysilicon film 27 with a thickness of 100 nm are successively formed on a surface of a p-type silicon substrate 1. A patterned resist film 25 is formed on the film 27 to produce the isolation region.

Figure 12A:
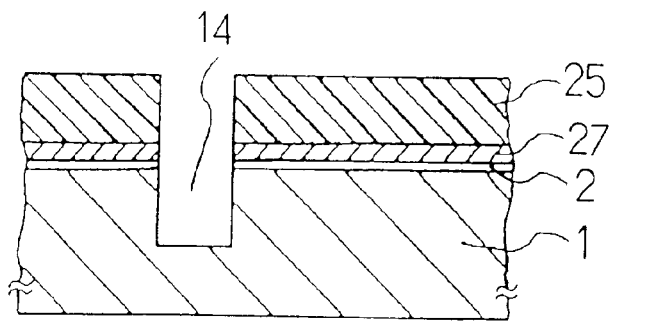
FIGS. 12A to 12K are partial cross-sectional views of a semiconductor device, which show the fabrication method according to the third embodiment, respectively.

Next, the polysilicon film 27 and the pad oxide film 2 are selectively etched using the resist film 25 as a mask. Then, using the same film 27 as a mask, the surface area of the substrate 1 is selectively etched by an RIE process, thereby producing a trench 14 with a depth of 500 nm, as shown in FIG. 12A.

Figure 12B:
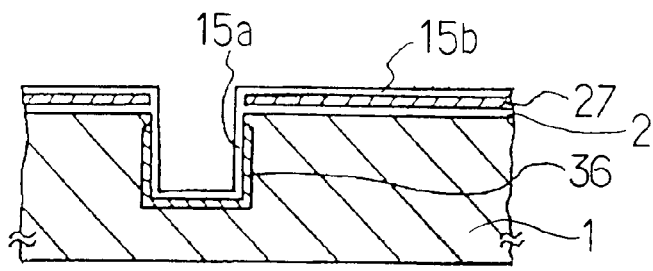

After removing the resist film 25, the substrate 1 is oxidized by a thermal oxidation process to thereby producing a silicon dioxide film 15a on the inner bottom and side faces of the trench 14 and a silicon dioxide film 15b on the surface of the polysilicon film 27. The state at this stage is shown in FIG. 12B.

Figure 12C:
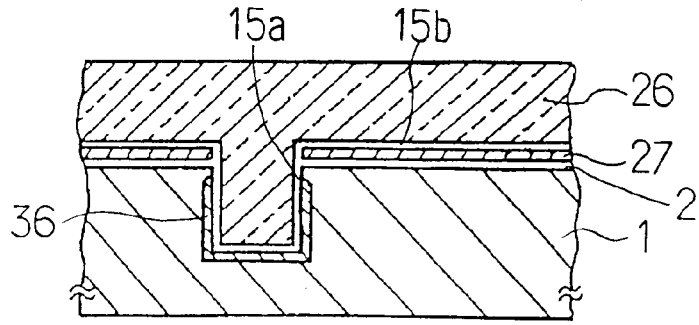

A boron-implantation region 36 is formed by an oblique ion-implantation process. A silicon dioxide film 26 with a thickness of 500 nm is deposited over the entire substrate 1 by a CVD process. Thus, the trench 14 is filled with the silicon dioxide film 26, as shown in FIG. 12C.

Figure 12D:
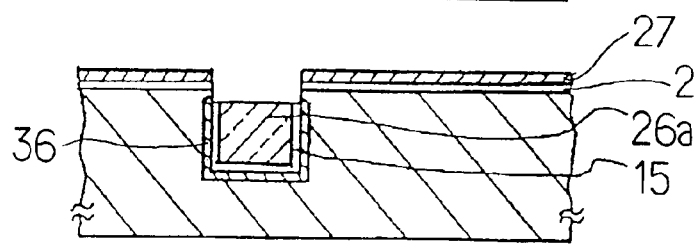

Subsequently, the silicon dioxide film 26 is then etched to be selectively left in the trench 14. Thus, a silicon dioxide film 26a is left in the trench 14, as shown in FIG. 12D. During this etching process, the polysilicon film 27 serves as an etching stop to protect the active region. The etching depth is adjusted so that the top of the remaining silicon dioxide film 26a in the trench 14 is lower than the surface of the substrate 1 by approximately 100 nm.

Figure 12E:
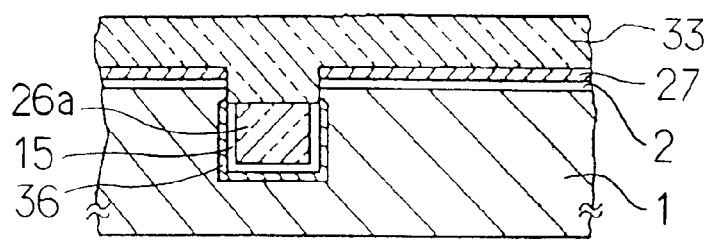

Next, a silicon nitride film 33 with a thickness of 200 nm is deposited over the entire substrate 1 by a CVD process, as shown in FIG. 12E. At this time, the surface of the silicon dioxide film 26a remaining in the trench 14 is lower than the surface of the substrate 1.

The silicon nitride film 33 is removed by a CMP process until the surface of the polysilicon film 27 is exposed. As a result, the remaining silicon nitride film 33a in the trench 14 is located on the silicon dioxide film 26a. In other words, the trench 14 is filled with the films 26a and 33a. The surface of this structure becomes substantially flat through this process. The remaining films 26a and 33a in the trench 14 constitute an isolation insulator.

Figure 12F:
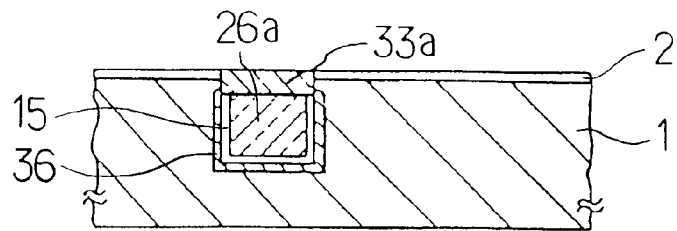

Further, the silicon nitride film 33a and polysilicon film 27 are etched back by a dry etching process using a $CF_4$ gas until the underlying pad oxide film 2 is exposed. The state at this stage is shown in FIG. 12F.

During this process, both the films 33 and 27 are removed at approximately the same etch rate. The endpoint of this dry etching process is detected by using the silicon dioxide film 2. Since this detection is realized by sensing luminescence from oxygen through the spectral analyses, the endpoint detection can be accurately controlled.

Thus, the isolation insulator made of the silicon dioxide film 26a and the silicon nitride film 33a existing in the trench 14 is obtained.

The silicon nitride film 33a can be made in self-alignment to the trench 14 using the mask for forming the trench 14.

Figure 12G:
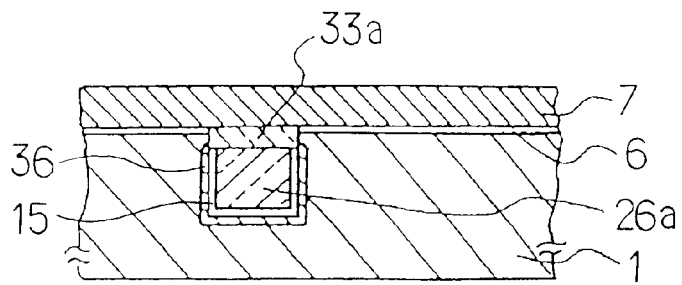

Subsequently, the remaining pad oxide film 2 is removed by a wet etching process using a HF solution. Then, a gate oxide film 6 with a thickness of 10 nm for a MOSFET is selectively formed on the surface of the active region. An n-type polysilicon film 7 with a thickness of 20 nm is deposited by a CVD process over the entire substrate 1. The state at this stage is shown in FIG. 12G.

Figure 12H:
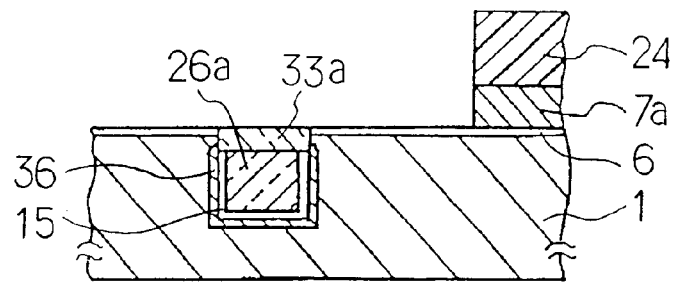

A patterned resist film 24 is formed on the polysilicon film 7. Using this film 24 as a mask, the polysilicon film 7 is selectively etched to thereby form the gate electrode 7a, as shown in FIG. 12H.

Figure 12I:
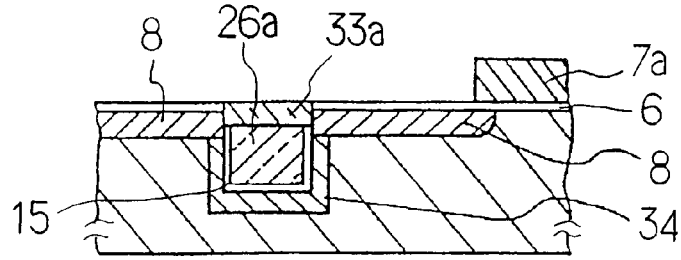

Using the isolation insulator and the gate electrode 7a as a mask, an n-type dopant such as arsenic is ion-implanted into the substrate 1 at an acceleration energy of 50 keV with a dose of $4 \times 10^{15}$ atoms/cm$^2$ and annealed, thereby producing an n-diffusion region 8 in the active region, as shown in FIG. 12I. This region 8 serves as a source/drain region of the MOSFET. At this time, the implanted region 36 becomes a channel stop region 34.

Figure 12J:
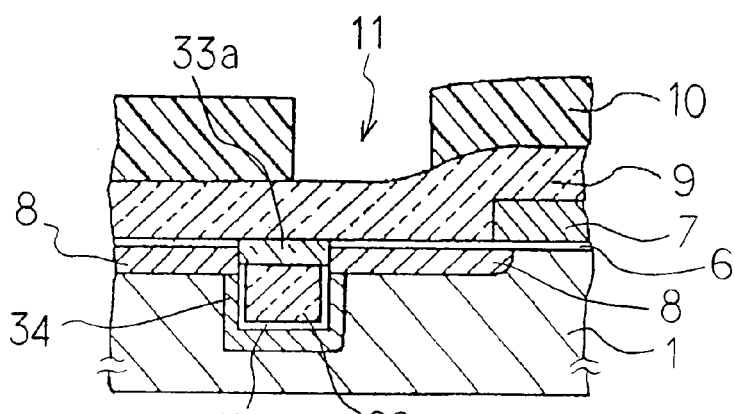

A silicon dioxide film with a thickness of 100 nm and a BPSG film with a thickness of 400 nm are successively deposited over the entire substrate 1. Then, they are annealed at a temperature of 850° C. for 30 minutes. Thus, an interlayer insulator film 9 made of the BPSG and silicon dioxide films is obtained, as shown in FIG. 12J.

Figure 12K:
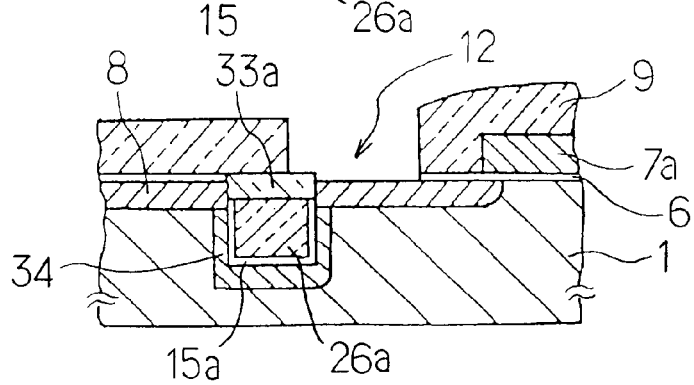

Using a patterned resist film 10 as a mask, the underlying interlayer insulating film 9 is selectively etched. Thus, a contact hole 12 exposing the surface of the substrate 1 is produced in the film 9, as shown in FIG. 12K. The resist film 10 is then removed.

In this etching process for the contact hole 12, when a gaseous mixture of $CF_4$ and $CH_2F_2$ is used as an etching gas, the silicon nitride film 33a in the trench 14 serves as an etching stop. As a result, the contact hole 12 does not reach the substrate 1. Then, the resist film 10 is removed.

Finally, as shown in FIG. 11, an aluminum-alloy film 13 is formed on the interlayer insulator film 9. The film 13 is then patterned to thereby produce an interconnection conductor film. The interconnection film 13 is contacted with the underlying n-type diffusion region 8 through the contact hole 12.

Through the process sequence as described above, the semiconductor device as shown in FIG. 11 is obtained.

With the device according to the second embodiment, there is an additional advantage that the fluctuation of the offset or step between the isolation insulator and the surface of the substrate 1 can be reduced.

In the above first to third embodiments, a silicon nitride film is used as the second insulating subregion. However, it is needless to say that any other insulating material such as silicon oxinitride ($Si_xO_yN_z$) may be used for the invention.

Also, although an n-channel MOSFET is shown in the above embodiments, any other devices such as a p-channel MOSFET, CMOS devices and BICMOS devices may be employed.

Further, instead of the CMP process, etch back process may be used.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device comprising the steps of:
   (a) selectively forming an oxidation-resistant film on a surface of a semiconductor substrate of a first conductivity type;
   (b) thermally oxidizing said substrate using said oxidation-resistant film as a mask, thereby forming selectively a field insulator film in a surface area of said substrate;

(c) selectively removing said field insulator film using said oxidation-resistant film as a mask until the top of said resultant field insulator film is lower than said surface of said substrate, thereby forming a first insulating subregion;

(d) forming a second insulating film to cover said first insulating subregion;

(e) selectively removing said second insulating film to thereby form a second insulating subregion on said first insulating subregion;

said first insulating subregion and said second insulating subregion constituting an isolation insulator defining an active region in the surface area of said substrate;

(f) selectively forming a conductive region of a second conductivity type in said active region to be contacted with said isolation insulator;

said second conductivity type being opposite to said first conductivity type;

(g) forming an interlayer insulating film to cover said active region and said isolation insulator;

said interlayer insulating film being different in material from said second insulating subregion;

(h) forming a contact hole in said interlayer insulating film to expose said conductive region by a selective etching process;

said process having an etch rate for said interlayer insulating film greater than that for said second insulating subregion; and (i) forming a patterned interconnection film on said interlayer insulating film to be contacted with said conductive region through said contact hole.

2. The method as claimed in claim 1, wherein said oxidation-resistant film comprises silicon nitride, said first insulating film comprises silicon oxides and said second insulating film comprises silicon nitride or silicon oxinitride.

3. The method as claimed in claim 1, wherein said step (e) of selectively removing said second insulating film is performed by a chemical mechanical polishing process.

4. A fabrication method of a semiconductor device comprising the steps of:

(a) selectively forming a trench in a surface area of a semiconductor substrate of a first conductivity type;

(b) forming a first insulating film on said surface area to bury said trench;

(c) selectively removing said first insulating film until the top of said remaining first insulating film is lower than a surface of said substrate, thereby forming a first insulating subregion;

(d) forming a second insulating film to cover said first insulating subregion;

(e) selectively removing said second insulating film to thereby form a second insulating subregion on said first insulating subregion;

said first insulating subregion and said second insulating subregion constituting an isolation insulator defining an active region in said surface area of said substrate;

(f) selectively forming a conductive region of a second conductivity type in said active region to be contacted with said isolation insulator;

said second conductivity type being opposite to said first conductivity type;

(g) forming an interlayer insulating film to cover said active region and said isolation insulator;

(h) forming a contact hole in said interlayer insulating film to expose said conductive region by a selective etching process;

said process having an etch rate for said interlayer insulating film greater than that for said second insulating subregion; and (i) forming a patterned interconnection film on said interlayer insulating film to be contacted with said conductive region through said contact hole.

5. The method as claimed in claim 4, wherein said first insulating film comprises silicon oxide and said second insulating film comprises silicon nitride or silicon oxinitride.

6. The method as claimed in claim 1, wherein said step (e) of selectively removing said second insulating film is performed by a chemical mechanical polishing process.

\* \* \* \* \*